(12) United States Patent
Toh et al.

(10) Patent No.: US 10,790,366 B2
(45) Date of Patent: Sep. 29, 2020

(54) DEVICES WITH LOWER RESISTANCE AND IMPROVED BREAKDOWN AND METHOD FOR PRODUCING THE SAME

(71) Applicant: GLOBALFOUNDRIES Singapore Pte. Ltd., Singapore (SG)

(72) Inventors: Eng Huat Toh, Singapore (SG); Shyue Seng Tan, Singapore (SG); Elgin Kiok Boone Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 124 days.

(21) Appl. No.: 15/879,079

(22) Filed: Jan. 24, 2018

(65) Prior Publication Data
US 2019/0229193 A1     Jul. 25, 2019

(51) Int. Cl.
*H01L 29/792* (2006.01)
*H01L 29/40* (2006.01)
(Continued)

(52) U.S. Cl.
CPC ........ *H01L 29/408* (2013.01); *H01L 29/0653* (2013.01); *H01L 29/1095* (2013.01);
(Continued)

(58) Field of Classification Search
None
See application file for complete search history.

(56) References Cited

U.S. PATENT DOCUMENTS

| 2007/0298572 A1 | 12/2007 | Chen et al. |
| 2014/0239371 A1* | 8/2014 | Tan ........ H01L 29/792 257/324 |
| 2016/0064510 A1* | 3/2016 | Mueller ........ H01L 29/516 257/295 |

FOREIGN PATENT DOCUMENTS

TW     201428971 A     7/2014

OTHER PUBLICATIONS

Tee et al., "Impact of Poly Filed Plate Dimension Towards LDMOS Performance", Published in Semiconductor Electronics, 2008, IEEE International Conference in Johor Bahru, Malaysia, retrieved on Oct. 20, 2017 from "http://ieeexplore.ieee.org/document/4770358/", pp. 436-440.

(Continued)

*Primary Examiner* — Joseph C. Nicely
*Assistant Examiner* — Lamont B Koo
(74) *Attorney, Agent, or Firm* — Ditthavong & Steiner, P.C.

(57) ABSTRACT

Methods of forming a ferroelectric material layer below a field plate for achieving increased $V_{br}$ with reduced $R_{dson}$ and resulting devices are provided. Embodiments include forming a N-Drift in a portion of the Si layer formed in a portion of a p-sub; forming an oxide layer over portions of the Si layer and the N-Drift; forming a gate over a portion of the oxide layer; forming a S/D extension region in the Si layer; forming first and second spacers on opposite sides of the gate and the oxide layer; forming a S/D region in the Si layer adjacent to the S/D extension region and a S/D region in the N-Drift remote from the Si layer; forming a U-shaped ferroelectric material layer over the oxide layer and the N-Drift, proximate or adjacent to the gate; and filling the U-shaped ferroelectric material layer with a metal, a field gate formed.

16 Claims, 12 Drawing Sheets

(51) Int. Cl.
*H01L 29/06* (2006.01)
*H01L 29/10* (2006.01)
*H01L 29/78* (2006.01)
*H01L 29/66* (2006.01)
*H01L 29/51* (2006.01)
*H01L 21/28* (2006.01)
*H01L 29/20* (2006.01)

(52) U.S. Cl.
CPC .......... *H01L 29/401* (2013.01); *H01L 29/402* (2013.01); *H01L 29/40111* (2019.08); *H01L 29/516* (2013.01); *H01L 29/66492* (2013.01); *H01L 29/66681* (2013.01); *H01L 29/7816* (2013.01); *H01L 29/7835* (2013.01); *H01L 29/2003* (2013.01)

(56) References Cited

OTHER PUBLICATIONS

Wu et al., "30-W/mm GaN HEMTs by Filed Plate Optimization", Published in IEEE Electron Device Letters, vol. 25, Issue 3, Mar. 2004, retrieved on Oct. 20, 2017 from "http://ieeexplore.ieee.org/document/1269895/", pp. 117-119.
Office Action for the related Taiwanese Application No. 107146807, dated Jun. 19, 2019, 22 pages.

\* cited by examiner

US 10,790,366 B2

DEVICES WITH LOWER RESISTANCE AND IMPROVED BREAKDOWN AND METHOD FOR PRODUCING THE SAME

TECHNICAL FIELD

The present disclosure relates to the manufacture of semiconductor devices, such as integrated circuits (ICs). The present disclosure is particularly applicable to medium-voltage (MV) to high-voltage (HV) ICs that need to exhibit high breakdown voltage ($V_{br}$) and low on resistance ($R_{dson}$).

BACKGROUND

ICs are striving to achieve a high $V_{br}$ as well as low $R_{dson}$. A problem with several MV and HV devices is the parasitic resistance associated with the lightly doped region, for example, doping in the n-type drift region (N-Drift) if lowered to reduce the electric field for achieving higher $V_{br}$, increases the parasitic external resistance ($R_{ext}$). Hence, the increased $V_{br}$ suffers from performance degradation due to the increased $R_{dson}$.

SUMMARY

A need therefore exists for methodology enabling increased $V_{br}$ with reduced $R_{dson}$ in MV and HV devices and the resulting device.

An aspect of the present disclosure is a method of forming a ferroelectric material layer below a field plate for achieving increased $V_{br}$ with reduced $R_{dson}$.

Another aspect of the present disclosure is a device including a ferroelectric material layer below a field plate.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a silicon (Si) layer in a portion of a p-type substrate (p-sub); forming a N-Drift in a portion of the Si layer; forming an oxide layer over adjacent portions of the Si layer and the N-Drift; forming a gate over a portion of the oxide layer; forming a S/D extension region in the Si layer; forming a first spacer and a second spacer on opposite sides of the gate; forming a S/D region in the Si layer adjacent to the S/D extension region and a S/D region in the N-Drift; forming a U-shaped ferroelectric material layer over the oxide layer and the N-Drift, proximate or adjacent to the gate; and filling the U-shaped ferroelectric material layer with a metal to form a field gate.

Aspects of the present disclosure include forming the gate by: forming a polysilicon layer over the oxide layer; and removing a portion of the polysilicon layer over the N-Drift and the Si layer down to the oxide layer, wherein a remaining portion of the polysilicon layer over the Si layer includes the gate and a remaining portion of the polysilicon layer over the N-Drift includes a dummy field gate. Further aspects include forming an oxide liner adjacent to each sidewall of the gate and the dummy field gate over the oxide layer prior to forming the first spacer and the second spacer. Another aspect includes forming a gap-filling material between the oxide liners between the gate and the dummy field gate. Additional aspects include forming the U-shaped ferroelectric material layer by: removing the dummy field gate between the oxide liners down to the oxide layer forming a cavity; and forming a ferroelectric material layer over and on sidewalls of the cavity. Another aspect includes forming the ferroelectric material layer by applying an atomic layer deposition (ALD) process. Further aspects include forming the U-shaped ferroelectric material layer to thickness of 7 nanometer (nm) to 20 nm. Another aspect includes forming a shallow trench isolation (STI) in the N-Drift below the dummy field gate. Additional aspects include forming the gate by: forming a polysilicon layer over the oxide layer. Further aspects include forming the U-shaped ferroelectric material layer by: forming a mask layer over the gate; planarizing a portion of the mask layer down to an upper surface of the gate over the N-Drift by chemical mechanical polishing (CMP); removing an exposed portion of the gate down to the oxide layer forming a cavity; and forming the U-shaped ferroelectric material layer over and on sidewalls of the cavity. Additional aspects include forming the U-shaped ferroelectric material layer to a thickness of 7 nm to 20 nm.

Another aspect of the present disclosure is a device including: a Si layer in a portion of a p-sub; a N-Drift in a portion of the Si layer; an oxide layer over adjacent portions of the Si layer and the N-Drift; a gate over a portion of the oxide layer; a first oxide liner adjacent to a sidewall of the gate and the oxide layer over the Si layer; a U-shaped ferroelectric material layer over the oxide layer and the N-Drift, proximate or adjacent to the gate; a field gate within the U-shaped ferroelectric material layer, an upper surface of the field gate coplanar with an upper surface of the U-shaped ferroelectric material layer; a first spacer adjacent to the first oxide liner and over the Si layer and a second spacer over the N-Drift on an opposite side of the gate remote from the Si layer; a second oxide liner between the U-shaped ferroelectric material layer and the second spacer over the N-Drift remote from the first oxide liner; a S/D extension region in the Si layer under the first spacer; and a S/D region in the Si layer adjacent to the S/D extension region and a S/D region in the N-Drift remote from the Si layer.

Aspects of the device include the U-shaped ferroelectric material layer proximate to the gate, the device further including: a third oxide liner and fourth oxide liner over the oxide layer adjacent to a sidewall of the gate and the U-shaped ferroelectric material layer, respectively; and a gap-filling material between the third oxide liner and the fourth oxide liner. Another aspect includes a STI in the N-Drift below the field gate. A further aspect includes the U-shaped ferroelectric material layer including hafnium silicon oxide ($HfSiO_x$), hafnium zirconium oxide ($HfZrO_2$), or barium titanate ($BaTiO_3$). Additional aspects include the U-shaped ferroelectric material layer having a thickness of 7 nm to 20 nm. Another aspect includes the field gate including a metal.

A further aspect of the present disclosure is a device including: a Si layer in a portion of a p-sub; a N-Drift in a portion of the Si layer; an oxide layer over adjacent portions of the Si layer and the N-Drift; a ferroelectric material layer over a portion of the oxide layer and a portion of the N-Drift; a gate over the ferroelectric material layer and the oxide layer; a first oxide liner adjacent to a sidewall of the gate and the oxide layer over Si layer and a second oxide liner adjacent to a sidewall of the gate, the ferroelectric material layer and the oxide layer over the N-Drift; a first spacer adjacent to the first oxide liner and over the Si layer and a second spacer adjacent to the second oxide liner and over the N-Drift; a S/D extension region in the Si layer under the first spacer; and a S/D region in the Si layer adjacent to the S/D extension region and a S/D region in the N-Drift.

Aspects of the present disclosure include the ferroelectric material layer having a thickness of 7 nm to 20 nm. Another aspect includes forming a STI in the N-Drift below a portion of the ferroelectric material layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of higher $R_{dson}$ while attaining higher $V_{br}$ attendant upon reduced doping in the N-Drift region. The problem is solved, inter alia, by forming a U-shaped ferroelectric material layer below a field plate to achieve lower $R_{dson}$ and higher $V_{br}$ through enhanced modulation of surface electric field and resistance by using ferroelectric engineering.

Methodology in accordance with embodiments of the present disclosure includes forming a Si layer in a portion of a p-sub. An N-Drift is formed in a portion of the Si layer. An oxide layer is formed over adjacent portions of the Si layer and the N-Drift. A gate is formed over a portion of the oxide layer. An S/D extension region is formed in the Si layer. A first spacer and a second spacer are formed on opposite sides of the gate. An S/D region is formed in the Si layer adjacent to the S/D extension region and an S/D region in the N-Drift. A U-shaped ferroelectric material layer is formed over the oxide layer, and the N-Drift proximate or adjacent to the gate, and the U-shaped ferroelectric material layer is filled with a metal to form a field gate.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
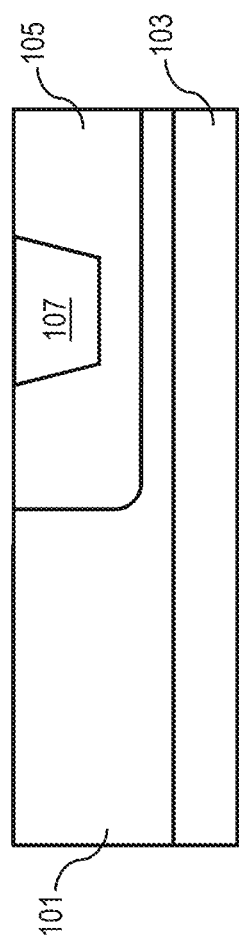
FIGS. 1 through 4 schematically illustrate cross-sectional views of a process flow for forming a HV gate with an enhanced field gate, in accordance with an exemplary embodiment.
Figure 2:
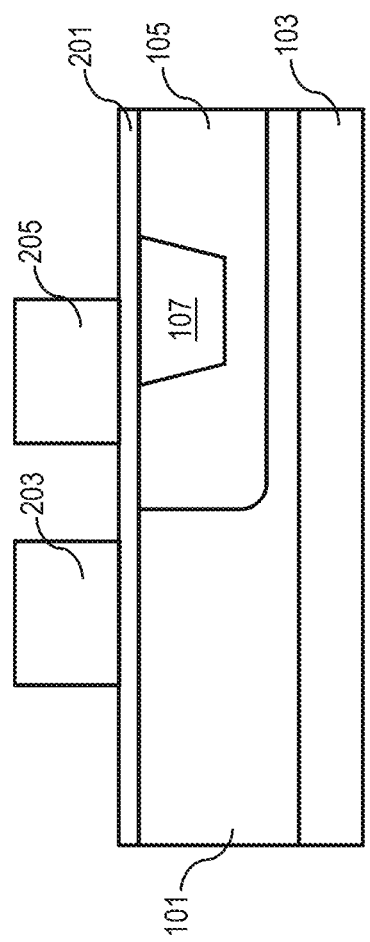
Figure 3:
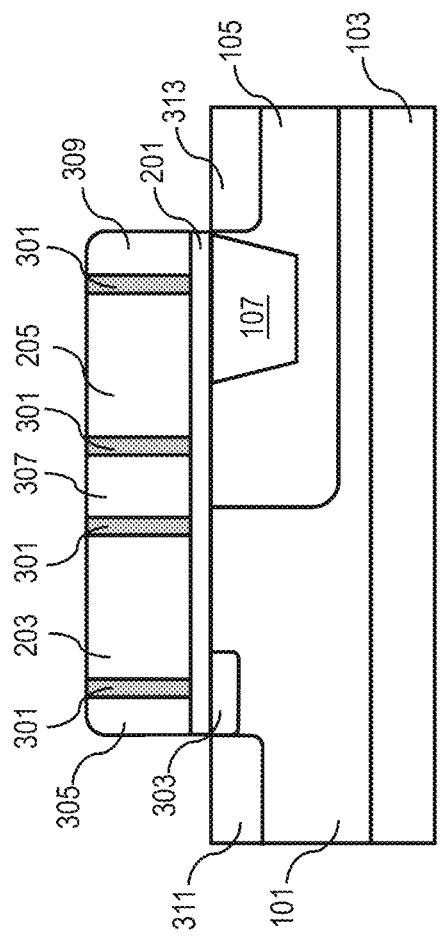

FIGS. 1 through 4 schematically illustrate cross-sectional views of a process flow for forming a HV gate with an enhanced field gate, in accordance with an exemplary embodiment. Referring to FIG. 1, a Si layer 101 is formed, e.g., to a thickness of 0.1 micrometer (μm) to 5 μm, over the p-sub 103. In one instance, the Si layer 101 is a high-voltage p-type well (HVPW). In another instance, the Si layer 101 may also be formed of gallium nitride (GaN) or any high resistivity materials. In a further instance, the Si layer 101 is p-type doped with boron (B) or indium (In). Then, an N-Drift 105 is formed, e.g., of Si or GaN or any high resistivity materials to a thickness of 0. μm to 5 μm, in a portion of the Si layer 101. In one instance, the N-Drift 105 is n-type doped with phosphorus (P) or arsenic (As). Next, an STI 107 is formed in a portion of the N-Drift 105. In one instance, the STI 107 is optional and may be formed before the Si layer 101. Subsequently, an oxide layer 201 is formed over the Si layer 101, the N-Drift 105 and the STI 107, as depicted in FIG. 2. In one instance, the oxide layer 201 is a high voltage oxide (HVOX), e.g., a thicker oxide ranging from 10 nm to 200 nm depending on voltage requirements. Then, a polysilicon layer (not shown for illustrative convenience) is formed over the oxide layer 201. Next, portions of the polysilicon layer over the Si layer 101 and the N-Drift 105 are removed down to the oxide layer 201, the remaining portion of the polysilicon layer over the Si layer 101 and N-Drift 105 forms a gate 203 and a dummy field gate 205, respectively. In one instance, the gate 203 is a HV gate. Thereafter, in FIG. 3, oxide liners 301 are formed, e.g., of high-temperature oxide (HTO) to a thickness of 0.2 nm to 5 nm and a width of 0.2 nm to 5 nm by a low pressure chemical vapor deposition (LPCVD) or a plasma enhanced chemical vapor deposition (PECVD), on the sidewalls of the gate 203 and the dummy field gate 205 and over portions of the oxide layer 201. Then, an S/D extension region 303 is formed in the Si layer 101 under the oxide layer 201. In one instance, the S/D extension region 303 may be formed before forming the oxide liners 301. Next, a silicon nitride (SiN) or an oxide layer (not shown for illustrative convenience) is conformally formed over the oxide layer 201, the oxide liners 301, the gate 203 and the dummy field gate 205. In one instance, the thickness of the SiN or oxide layer is at least equal to or more than half of the gap between the two neighboring oxide liners 301 such that the SiN or oxide layer completely fills the gap through pinch-off. Subsequently, the SiN or oxide layer is etched, e.g., by a directional dry etch process, forming spacers 305, 307 and 309 on the sidewall of the oxide liners 301 and over the oxide layer 201. Then, an S/D region 311 is formed in the Si layer 101 and an S/D region 313 is formed in the N-Drift 105. In one instance, the spacer 307 may include two spacers with inter layer dielectric (ILD) in-between (not shown for illustrative convenience). In this instance, the ILD is formed by a conventional back-end-of-line (BEOL) process filling a gap between the two spacers. Subsequently, a CMP is performed to planarize the surface. In such case, the field gate 205 may be connected individually to a separate bias or to the HV gate 203 or to the S/D region 311 through metal connections.

Figure 4:
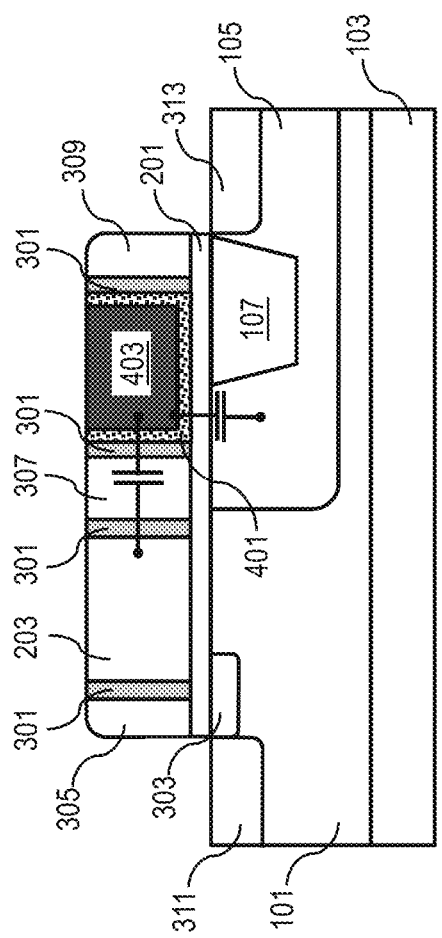

Referring to FIG. 4, the dummy field gate 205 between the oxide liners 301 is removed exposing the oxide layer 201 and a cavity (not shown for illustrative convenience) is formed. Next, a U-shaped ferroelectric material layer 401 is formed, e.g., of $HfSiO_x$, $HfZrO_2$, $BaTiO_3$ or any other suitable ferroelectric materials to a thickness of 7 nm to 20 nm, over the exposed oxide layer 201 and on sidewalls of the cavity. Subsequently, the U-shaped ferroelectric material layer 401 is filled with metal, thereby forming a field gate 403. In this instance, the upper surface of the field gate 403 is coplanar with the upper surface of the U-shaped ferroelectric material layer 401, e.g., as a result of CMP. In one instance, rather than filling U-shaped ferroelectric material layer 401 with metal, the U-shaped ferroelectric material layer 401 is filled with polysilicon. In one instance, reduced surface electric field is achieved through gate 203 coupling or bias, wherein the field gate 403 is shorted to the gate 203. When the gate 203 is turned-on to a positive bias, it is coupled to the field gate 403, and the ferroelectric material layer 401 amplifies the voltage, e.g., by 25%, thereby allowing lower resistance. In addition, the field gate 403 may be biased to a negative voltage during off-state and to a positive voltage during on-state, the voltage may be amplified both ways through the ferroelectric material layer 401 to further reduce the electric field during off-state and accumulate carriers during on-state.

Figure 5:
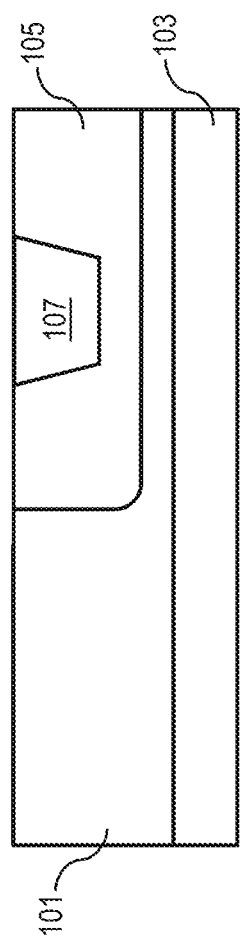
FIGS. 5 through 8 schematically illustrate cross-sectional views of a process flow for forming a common HV gate with dual dielectric, in accordance with an exemplary embodiment.
Figure 6:
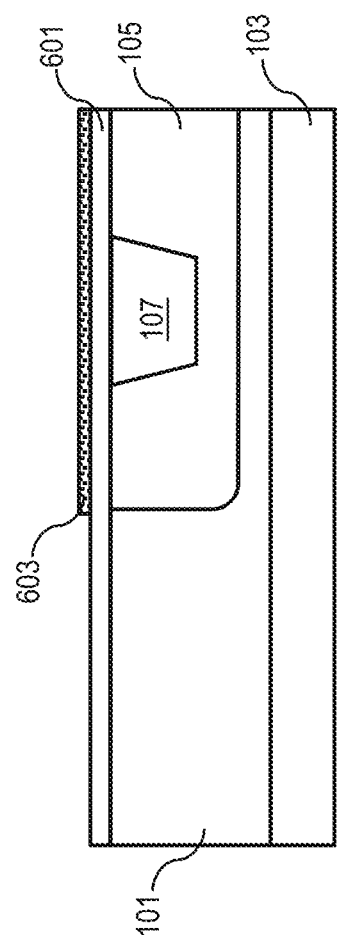
Figure 7:
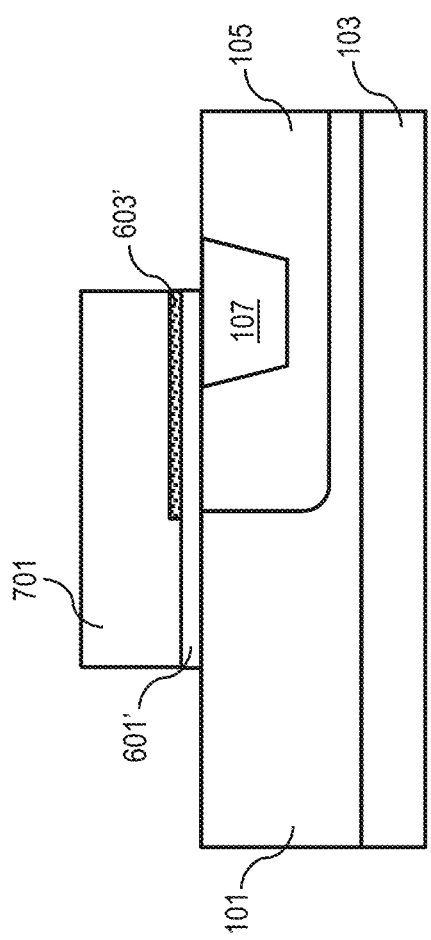
Figure 8:
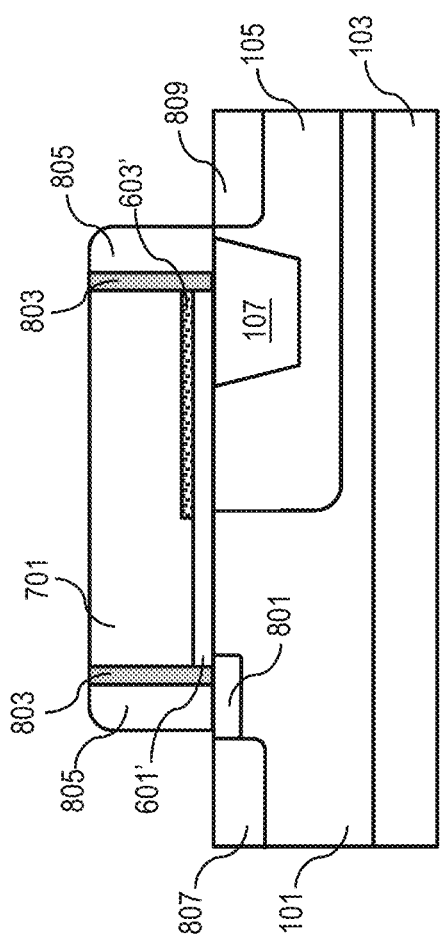

FIGS. 5 through 8 schematically illustrate cross-sectional views of a process flow for forming a common HV gate with dual dielectric, in accordance with an exemplary embodiment. The process steps of FIG. 5 are identical to the process steps of FIG. 1. Referring to FIG. 6, an oxide layer 601 is formed over portions of the Si layer 101, the N-Drift 105 and the STI 107. Then, a ferroelectric material layer 603 is formed, e.g., of $HfSiO_x$, $HfZrO_2$, $BaTiO_3$ or any other suitable ferroelectric materials to a thickness of 5 nm to 200 nm, over a portion of the oxide layer 601 over the N-Drift 105. Next, a polysilicon layer (not shown for illustrative convenience) is formed over the oxide layer 601 and the ferroelectric material layer 603. Subsequently, portions of the polysilicon layer, the oxide layer 601 and the ferroelectric material layer 603 are removed, thereby forming a gate 701 over the ferroelectric material layer 603' and a portion of the oxide layer 601', as depicted in FIG. 7. In one instance, the gate 701 is a HV gate. As illustrated, the oxide layer 601' is aligned to the edges of the gate 701 after etching. Next, in FIG. 8, an S/D extension region 801 is formed in the Si layer 101. Then, oxide liners 803 are formed, e.g., of HTO to a thickness of 0.2 nm to 5 nm and a width of 0.2 nm to 5 nm by LPCVD or PECVD, on the sidewalls of the gate 701, the oxide layer 601' and one of the sidewall of the ferroelectric material layer 603' over the Si layer 101 and the N-Drift 105, respectively. Subsequently, spacers 805 are formed on the sidewalls of the oxide liners 803 and over the Si layer 101 and the N-Drift 105 following a similar process flow as described in FIGS. 1 through 4. Then, S/D regions 807 and 809 are formed in the Si layer 101 and the N-Drift 105, respectively.

Figure 9:
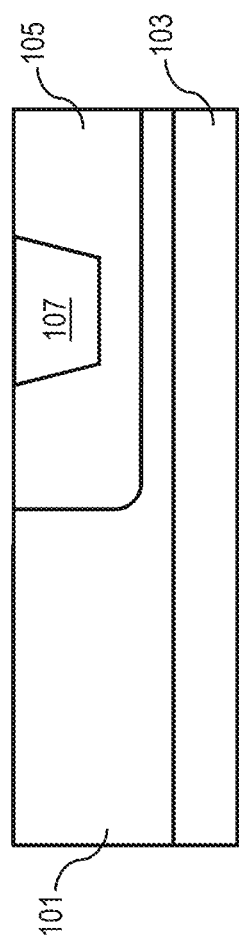
FIGS. 9 through 12 schematically illustrate cross-sectional views of a process flow for forming a HV gate with a side replacement field gate, in accordance with an exemplary embodiment.
Figure 10:
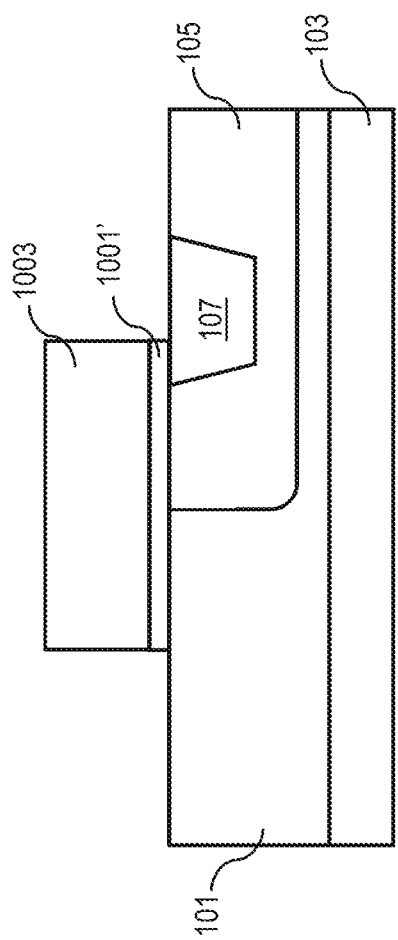
Figure 11:
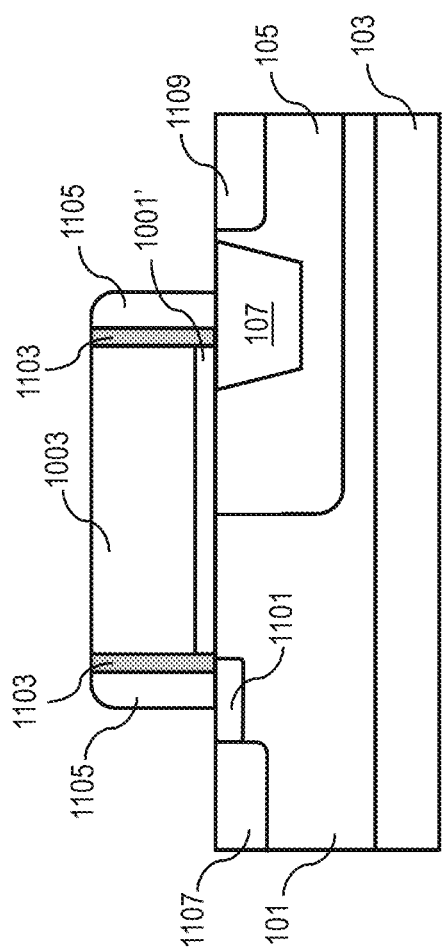

FIGS. 9 through 12 schematically illustrate cross-sectional views of a process flow for forming a HV gate with a side replacement field gate, in accordance with an exemplary embodiment. The process steps of FIG. 9 are identical to the process steps of FIGS. 1 and 5. Referring to FIG. 10, an oxide layer 1001 is formed over the Si layer 101, the N-Drift 105 and the STI 107. Then, a polysilicon layer (not shown for illustrative convenience) is formed over the oxide layer 1001. Subsequently, portions of the polysilicon layer and the oxide layer 1001 are removed, thereby forming a gate 1003 over a portion of the oxide layer 1001'. As illustrated, the oxide layer 1001' is aligned to the edges of the gate 1003 after etching. Next, an S/D extension region 1101 is formed in the Si layer 101, as depicted in FIG. 11. Then, oxide liners 1103 are formed on the sidewalls of the gate 1003 and the oxide layer 1001' over the Si layer 101 and the N-Drift 105, respectively. Subsequently, spacers 1105 are formed on the sidewalls of the oxide liners 1103 and over the over the Si layer 101 and the N-Drift 105 following a similar process flow as described in FIGS. 1 through 4. Then, S/D regions 1107 and 1109 are formed in the Si layer 101 and the N-Drift 105, respectively.

Figure 12:
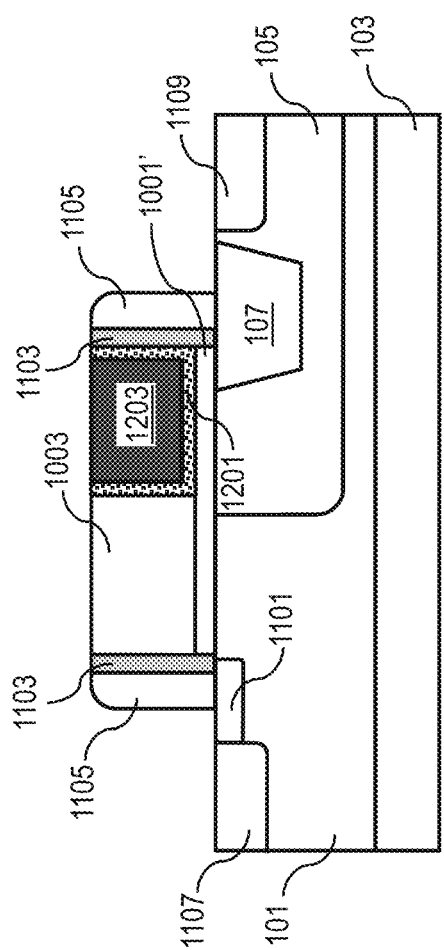

Referring to FIG. 12, a mask layer (not shown for illustrative convenience) is formed, e.g., of ILD, over the gate 1003. Next, a portion of the mask layer is removed down to an upper surface of the gate 1003 over the N-Drift 105. Subsequently, the exposed portion of the gate 1003 is removed down to the oxide layer 1001', thereby forming a cavity (not shown for illustrative convenience). Thereafter, a U-shaped ferroelectric material layer 1201 is formed, e.g., to a thickness of 7 nm to 20 nm, over and on sidewalls of the cavity. Subsequently, the U-shaped ferroelectric material layer 1201 is filled with metal, thereby forming a field gate 1203. In this instance, the upper surface of the field gate 1203 is coplanar with the upper surface of the U-shaped ferroelectric material layer 1201, e.g., by CMP.

The embodiments of the present disclosure can achieve several technical effects, including a significantly amplified voltage, e.g., by more than 25%, through the ferroelectric material to reduce the surface electric field in off-state and reduce the $R_{dson}$ in on-state. In addition, the present disclosure can achieve an enhanced $R_{dson}$-$V_{br}$ performance. Further, the ferroelectric material may be freely employed by the core logic, otherwise a minimal cost of depositing and annealing the ferroelectric material is required. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated MV to HV semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:
1. A method comprising:
   forming a silicon (Si) layer in a portion of a p-type substrate (p-sub);
   forming a n-type drift region (N-Drift) in a portion of the Si layer;

forming an oxide layer over adjacent portions of the Si layer and the N-Drift;

forming a gate over a portion of the oxide layer, wherein forming the gate comprises:

forming a polysilicon layer over the oxide layer; and removing a portion of the polysilicon layer over the N-Drift and the Si layer down to the oxide layer, wherein a remaining portion of the polysilicon layer over the Si layer comprises the gate and a remaining portion of the polysilicon layer over the N-Drift comprises a dummy field gate;

forming a source/drain (S/D) extension region in the Si layer;

forming a first spacer and a second spacer on opposite sides of the gate;

forming a S/D region in the Si layer adjacent to the S/D extension region and a S/D region in the N-Drift;

forming a U-shaped ferroelectric material layer over the oxide layer and the N-Drift, proximate or adjacent to the gate; and filling the U-shaped ferroelectric material layer with a metal to form a field gate.

2. The method according to claim 1, further comprising forming an oxide liner adjacent to each sidewall of the gate and the dummy field gate over the oxide layer prior to forming the first spacer and the second spacer.

3. The method according to claim 2, further comprising forming a gap-filling material between the oxide liners between the gate and the dummy field gate.

4. The method according to claim 3, wherein forming the U-shaped ferroelectric material layer comprises:

removing the dummy field gate between the oxide liners down to the oxide layer forming a cavity; and forming a ferroelectric material layer over and on sidewalls of the cavity.

5. The method according to claim 4, comprising forming the ferroelectric material layer by applying an atomic layer deposition (ALD) process.

6. The method according to claim 4, comprising forming the U-shaped ferroelectric material layer to thickness of 7 nanometer (nm) to 20 nm.

7. The method according to claim 1, further comprising forming a shallow trench isolation (STI) in the N-Drift below the dummy field gate.

8. The method according to claim 1, wherein forming the gate comprises:

forming a polysilicon layer over the oxide layer.

9. The method according to claim 8, wherein forming the U-shaped ferroelectric material layer comprises:

forming a mask layer over the gate;

planarizing a portion of the mask layer down to an upper surface of the gate over the N-Drift by chemical mechanical polishing (CMP);

removing an exposed portion of the gate down to the oxide layer forming a cavity; and forming the U-shaped ferroelectric material layer over and on sidewalls of the cavity.

10. The method according to claim 9, comprising forming the U-shaped ferroelectric material layer to a thickness of 7 nm to 20 nm.

11. A device comprising:

a silicon (Si) layer in a portion of a p-type substrate (p-sub);

a n-type drift region (N-Drift) in a portion of the Si layer;

an oxide layer over adjacent portions of the Si layer and the N-Drift;

a gate over a portion of the oxide layer;

a first oxide liner adjacent to a sidewall of the gate and the oxide layer over the Si layer;

a U-shaped ferroelectric material layer over the oxide layer and the N-Drift, proximate or adjacent to the gate;

a field gate within the U-shaped ferroelectric material layer, an upper surface of the field gate coplanar with an upper surface of the U-shaped ferroelectric material layer;

a first spacer adjacent to the first oxide liner and over the Si layer and a second spacer over the N-Drift on an opposite side of the gate remote from the Si layer;

a second oxide liner between the U-shaped ferroelectric material layer and the second spacer over the N-Drift remote from the first oxide liner;

a source/drain (S/D) extension region in the Si layer under the first spacer; and a S/D region in the Si layer adjacent to the S/D extension region and a S/D region in the N-Drift remote from the Si layer.

12. The device according to claim 11, wherein the U-shaped ferroelectric material layer is proximate to the gate, the device further comprising:

a third oxide liner and fourth oxide liner over the oxide layer adjacent to a sidewall of the gate and the U-shaped ferroelectric material layer, respectively; and a gap-filling material between the third oxide liner and the fourth oxide liner.

13. The device according to claim 10, further comprising:

a shallow trench isolation (STI) in the N-drift below the field gate.

14. The device according to claim 11, wherein the U-shaped ferroelectric material layer comprises hafnium silicon oxide ($HfSiO_x$), hafnium zirconium oxide ($HfZrO_2$), or barium titanate ($BaTiO_3$).

15. The device according to claim 11, wherein the U-shaped ferroelectric material layer has a thickness of 7 nanometer (nm) to 20 nm.

16. The device according to claim 11, wherein the field gate comprises a metal.

\* \* \* \* \*